United States Patent
Cao et al.

(10) Patent No.: US 12,015,404 B2
(45) Date of Patent: Jun. 18, 2024

(54) LOGIC PROCESS-BASED LEVEL CONVERSION CIRCUIT OF FLASH FIELD PROGRAMMABLE GATE ARRAY (FPGA)

(71) Applicant: WUXI ESIONTECH CO., LTD., Wuxi (CN)

(72) Inventors: Zhengzhou Cao, Wuxi (CN); Yueer Shan, Wuxi (CN); Zhenkai Ji, Wuxi (CN); Jing Sun, Wuxi (CN); Chunyan He, Wuxi (CN); Guangming Li, Wuxi (CN)

(73) Assignee: WUXI ESIONTECH CO., LTD., Wuxi (CN)

( * ) Notice: Subject to any disclaimer, the term of this patent is extended or adjusted under 35 U.S.C. 154(b) by 162 days.

(21) Appl. No.: 17/940,001

(22) Filed: Sep. 8, 2022

(65) Prior Publication Data

US 2023/0006672 A1    Jan. 5, 2023

Related U.S. Application Data

(63) Continuation of application No. PCT/CN2022/102650, filed on Jun. 30, 2022.

(30) Foreign Application Priority Data

Dec. 22, 2021   (CN) .......................... 202111582292.0

(51) Int. Cl.
   *H03K 19/173*   (2006.01)
(52) U.S. Cl.
   CPC ............................... *H03K 19/1733* (2013.01)

(58) Field of Classification Search
   None
   See application file for complete search history.

(56) References Cited

U.S. PATENT DOCUMENTS

| | | | |
|---|---|---|---|
| 2014/0306684 A1* | 10/2014 | Cheng | G05F 3/08 323/311 |
| 2016/0142056 A1* | 5/2016 | Kuo | H03K 19/018521 345/213 |

(Continued)

FOREIGN PATENT DOCUMENTS

| | | |
|---|---|---|
| CN | 102893320 A | 1/2013 |
| CN | 103795401 A | 5/2014 |

(Continued)

*Primary Examiner* — Jany Richardson
(74) *Attorney, Agent, or Firm* — Bayramoglu Law Offices LLC

(57) ABSTRACT

A logic process-based level conversion circuit of a flash flash field programmable gate array (FPGA) performs three-stage level conversion by using three conversion modules. A first-stage conversion module is configured to convert an input first signal of a VDD-GND voltage domain into a second signal of a VP1-GND voltage domain, an intermediate-stage conversion module is configured to convert the input second signal of the VP1-GND voltage domain into a third signal of a VP1-VN voltage domain, and a drive-stage conversion module is configured to convert the input third signal of the VP1-VN voltage domain into a drive signal of a VP2-VN voltage domain and output a drive word line. The logic process-based level conversion circuit reduces the pressure of conversion at each stage, ensures a capability of driving the next stage, increases the conversion speed, and provides a large driving capability at the last stage.

13 Claims, 3 Drawing Sheets

(56) References Cited

U.S. PATENT DOCUMENTS

2018/0358969 A1* 12/2018 Davies ............ H03K 19/018521
2023/0020524 A1*  1/2023 Shan ................ H03K 19/17748
2024/0088897 A1*  3/2024 Lin ................. H03K 19/018507

FOREIGN PATENT DOCUMENTS

| CN | 104882162 A | 9/2015 |
| CN | 107045893 A | 8/2017 |
| CN | 114285405 A | 4/2022 |
| JP | 2002150784 A | 5/2002 |

* cited by examiner

LOGIC PROCESS-BASED LEVEL CONVERSION CIRCUIT OF FLASH FIELD PROGRAMMABLE GATE ARRAY (FPGA)

CROSS REFERENCE TO THE RELATED APPLICATIONS

This application is the continuation application of International Application No. PCT/CN2022/102650, filed on Jun. 30, 2022, which is based upon and claims priority to Chinese Patent Application No. 202111582292.0, filed on Dec. 22, 2021, the entire contents of which are incorporated herein by reference.

TECHNICAL FIELD

The present disclosure relates to the field of flash field programmable gate array (FPGA), and in particular, to a logic process-based level conversion circuit of a flash FPGA.

BACKGROUND

A flash FPGA is a programmable logic circuit based on flash memory technology. A programmable wiring switch matrix is composed of flash cells. Different flash switch paths are selected by configuring the flash cells to realize a programmable logic function for a user.

The flash FPGA has a high start-up speed and can quickly enter a working state after being powered on. Therefore, the flash FPGA has become a mainstream programmable logic device and is widely applied to signal processing and control. The flash FPGA provides the user with logic having hundreds of thousands to millions of system equivalent gates, has a working frequency up to 350 MHz, and provides a large number of IP cores. Different from a flash memory that is designed and manufactured based on a specific process, the flash FPGA needs to be designed and manufactured based on a logic process.

A relatively high voltage is required to erase and program the flash cell, and a control logic working under a voltage domain of a low voltage (VDD) of the core needs to be converted into a control logic working under a voltage domain of a positive high voltage and a negative high voltage required for the erasure and programming. Unlike the specific process of the flash memory, the logic process cannot accommodate devices working under various voltages. Therefore, the flash FPGA needs to be designed according to a break-down voltage of a logic process-based device. The maximum working voltage and break-down voltage that the logic process can usually provide for the device are 5 V and 12 V, respectively. In addition, in the flash FPGA, flash cell arrays are scattered as small blocks in a whole chip, a word line and a bit line are relatively long, and the load is relatively large. In order to ensure the driving of the word line and the bit line, the word line and the bit line are large in size, which also requires a front-stage circuit (namely, a level conversion circuit) for the word line and the bit line to have a relatively large driving force and a relatively high conversion speed.

SUMMARY

Technical Problem

A relatively high voltage is required to erase and program a flash cell, and a low voltage (VDD) of the control logic of a core needs to be converted into a positive high voltage and a negative high voltage required for the erasure and programming. Unlike the specific process of flash memory, the logic process cannot accommodate devices requiring various voltages. Therefore, a flash FPGA needs to be designed based on a break-down voltage of a logic process-based device. A maximum working voltage and break-down voltage that the logic process can usually provide for the device are 5 V and 12 V, respectively. In addition, in the flash FPGA, flash cell arrays are scattered as small blocks in a whole chip, a word line and a bit line are relatively long, and the load is relatively large. In order to ensure the driving of the word line and the bit line, the word line and the bit line are large in size, which also requires a front-stage circuit (namely, a level conversion circuit) for the word line and the bit line to have a relatively large driving force and a relatively high conversion speed.

Solutions to the Problems

Technical Solutions

To resolve the above problems and meet the above technical requirements, the inventor proposed a logic process-based level conversion circuit of a flash FPGA. The technical solutions of the present disclosure are as follows:

A logic process-based level conversion circuit of a flash FPGA includes a first-stage conversion module, an intermediate-stage conversion module, and a drive-stage conversion module that are successively cascaded.

The first-stage conversion module is configured to convert an input first signal of a VDD-GND voltage domain into a second signal of a VP1-GND voltage domain and output the second signal to the intermediate-stage conversion module. The intermediate-stage conversion module is configured to convert the input second signal of the VP1-GND voltage domain into a third signal of a VP1-VN voltage domain and output the third signal to the drive-stage conversion module. The drive-stage conversion module is configured to convert the input third signal of the VP1-VN voltage domain into a drive signal of a VP2-VN voltage domain and output a word line for driving the flash FPGA.

A logic process is controlled to output a corresponding voltage combination to complete an erasure operation or a programming operation on the flash FPGA, where the voltage combination includes a core low voltage VDD, an intermediate voltage VP1, a drive-stage voltage VP2, and a negative voltage VN that are provided by the logic process, where GND is a grounding voltage, and VP2≥VP1≥VDD.

As a further technical solution, when the programming operation is performed on the flash FPGA, voltage values of the core low voltage VDD, the intermediate voltage VP1, and the drive-stage voltage VP2 provided by the logic process are controlled to increase successively. The voltage value of the drive-stage voltage VP2 is a positive high voltage HV required for programming a flash cell. The drive signal of the VP2-VN voltage domain output by the drive-stage conversion module controls the word line to apply the positive high voltage HV to a gate terminal of the flash cell to complete the programming operation.

As a further technical solution, when the erasure operation is performed on the flash FPGA, voltage values of the intermediate voltage VP1, the drive-stage voltage VP2, and the core low voltage VDD provided by the logic process are controlled to be equal, the negative voltage VN provided by the logic process is controlled to be a negative high voltage LV required for erasing a flash cell, and the drive signal of the VP2-VN voltage domain output by the drive-stage conversion module controls the word line to apply the negative high voltage LV to a gate terminal of the flash cell to complete the erasure operation.

As a further technical solution, each of the intermediate-stage conversion module and the drive-stage conversion module is provided with voltage dividing switch transistors for voltage division, and the voltage dividing switch transistors of each of the two conversion modules are controlled by a gate voltage control signal. The voltage values of the gate voltage control signal are different in different time periods of a working cycle of the level conversion circuit to adjust states of the voltage dividing switch transistors and reduce the working time of a device in the level conversion circuit under a break-down voltage.

As a further technical solution, both the second signal and the third signal are differential signals. In the intermediate-stage conversion module, sources of positive channel metal oxide semiconductor (PMOS) transistors P3, P4, P5, and P6 are connected to each other and to the intermediate voltage VP1, a drain of P4 is connected to a drain of a negative channel metal oxide semiconductor (NMOS) transistor N3, and a source of N3 is connected to a drain of an NMOS transistor N5. A drain of P5 is connected to a drain of an NMOS transistor N4, and a source of N4 is connected to a drain of an NMOS transistor N6. A source of N5 and a source of N6 are connected to each other and to the negative voltage VN. A drain of P3, a gate of P4, the drain of P5, and a gate of N5 are all connected, a drain of P6, a gate of P5, the drain of P4, and a gate of N6 are all connected, a gate of P3 and a gate of P6 are configured as a differential pair for obtaining the second signal, and the gate of N5 and the gate of N6 are configured as a differential pair for outputting the third signal. N3 and N4 are configured as the voltage dividing switch transistors in the intermediate-stage conversion module, and a gate of N3 and a gate of N4 are connected and controlled by the gate voltage control signal.

As a further technical solution, both the third signal and the drive signal are differential signals. In the drive-stage conversion module, sources of PMOS transistors P7 and P8 are connected to each other and to the drive-stage voltage VP2, a drain of P7 is connected to a gate of P8 and a drain of an NMOS transistor N7, and a drain of P8 is connected to a gate of P7 and a drain of an NMOS transistor N8, a source of N7 is connected to a drain of an NMOS transistor N9, a source of N8 is connected to a drain of an NMOS transistor N10, and a source of N9 and a source of N10 are connected to each other and to the negative voltage VN. A gate of N9 and a gate of N10 are configured as a differential pair for obtaining the third signal, and the drain of N7 and the drain of N8 are configured as a differential pair for outputting the drive signal. N7 and N8 are configured as the voltage dividing switch transistors in the drive-stage conversion module, and a gate of N7 and a gate of N8 are connected and controlled by the gate voltage control signal.

As a further technical solution, in any working cycle of performing the programming operation or the erasure operation on the flash FPGA, the working cycle successively includes a level conversion phase and a maintenance phase. The level conversion phase is used to complete signal conversion in different voltage domains, and the maintenance phase is used to maintain a signal state. In the maintenance phase of the working cycle, the voltage value of the gate voltage control signal is the negative voltage VN, the voltage dividing switch transistors N3 and N4 in the intermediate-stage conversion module are turned off, the voltage dividing switch transistors N7 and N8 in the drive-stage conversion module are turned off, a state of the level conversion circuit is maintained by voltages of parasitic capacitors of the circuit and the level conversion circuit is not driven in a pull-down manner. Charges on the parasitic capacitors enable data to be retained, but a voltage difference formed by the charges on the parasitic capacitors is less than the break-down voltage of the device to protect P3, P4, P5, and P6 in the intermediate-stage conversion module and P7 and P8 in the drive-stage conversion module.

The intermediate-stage conversion module has a parasitic capacitor between P4 and N3 and a parasitic capacitor between P5 and N4, and the drive-stage conversion module has a parasitic capacitor between P7 and N7 and a parasitic capacitor between P8 and N8.

As a further technical solution, in any working cycle of performing the programming operation or the erasure operation on the flash FPGA, in the level conversion phase of the working cycle, the voltage value of the gate voltage control signal is equal to the intermediate voltage VP1. When the programming operation is performed on the flash FPGA, the positive high voltage HV in the drive-stage conversion module cannot be transmitted to N9 and N10 due to clamping of the voltage dividing switch transistors N7 and N8, such that safety voltage tolerances of N7, N8, N9, and N10 are increased.

As a further technical solution, in any working cycle, the duration of the maintenance phase is greater than the duration of the level conversion phase.

As a further technical solution, the first signal is a single-ended signal, and the second signal is a differential signal. In the first-stage conversion module, sources of PMOS transistors P1 and P2 are connected to each other and to the intermediate voltage VP1, a drain of P1 is connected to a gate of P2 and a drain of an NMOS transistor N1, a drain of P2 is connected to a gate of P1 and a drain of an NMOS transistor N2, and a source of N1 and a source of N2 are connected to each other and to GND.

A source of a PMOS transistor P0 is connected to the core low voltage VDD, a drain of P0 is connected to a drain of an NMOS transistor N0, a source of N0 is connected to GND, a gate of P0 and a gate of N0 are connected, the gate of P0 obtains the first signal, the gate of N0 obtains the first signal, the drain of P0 outputs an inverse signal of the first signal and is connected to a gate of N1, a gate of N2 obtains the first signal, and the drain of P1 and the drain of P2 are configured as a differential pair for outputting the second signal.

Beneficial Effects

The present disclosure provides a logic process-based level conversion circuit of a flash FPGA. The level conversion circuit performs three-stage level conversion by using three conversion modules to realize conversion to an intermediate voltage and then to the highest voltage, which reduces the pressure of conversion at each stage, ensures a capability of driving the next stage, increases a conversion speed, and provides a large driving capability at the last stage.

In addition, the level conversion circuit is designed based on a break-down voltage of a device, and the device cannot work under the break-down voltage for a long time. Therefore, voltage dividing switch transistors are connected in series in the level conversion circuit for voltage division. In addition, timing control is performed on a gate voltage control signal to reduce the working time of the device under the break-down voltage, thereby improving the reliability of the device.

BRIEF DESCRIPTION OF THE DRAWINGS

Description of the Drawings

Figure 1:
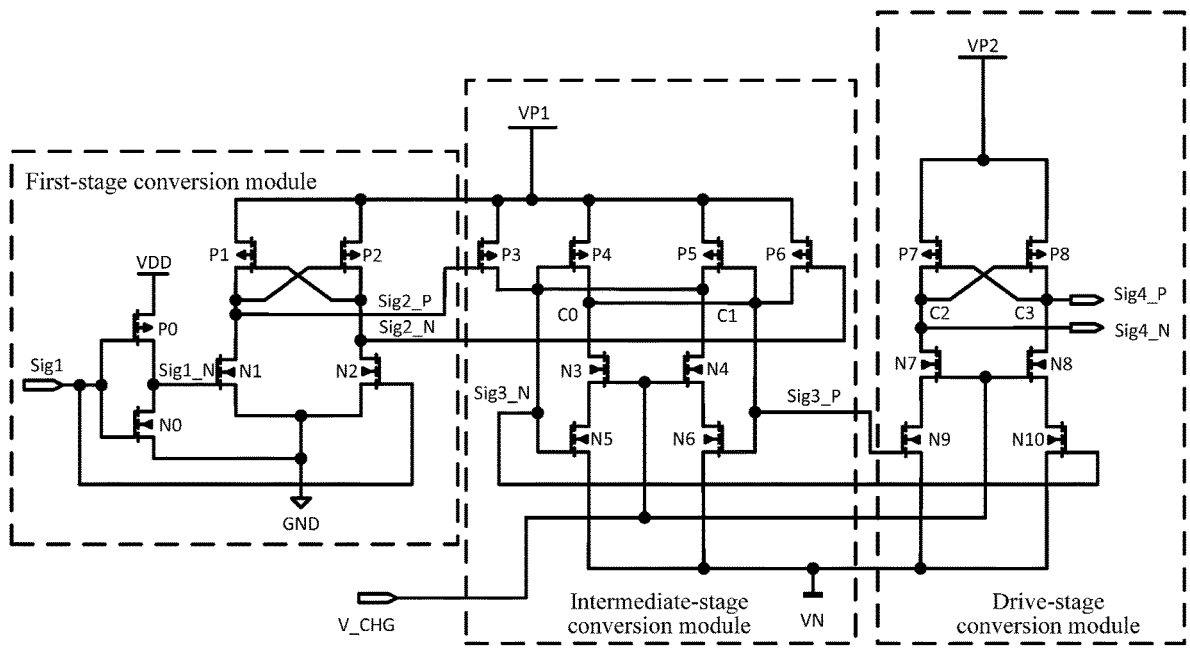
Figure 2:
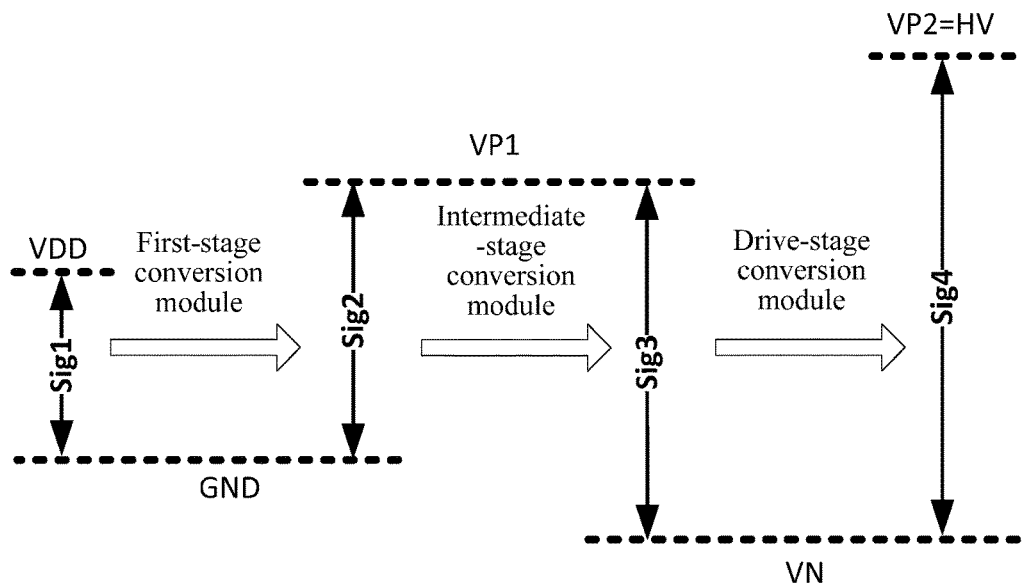
Figure 3:
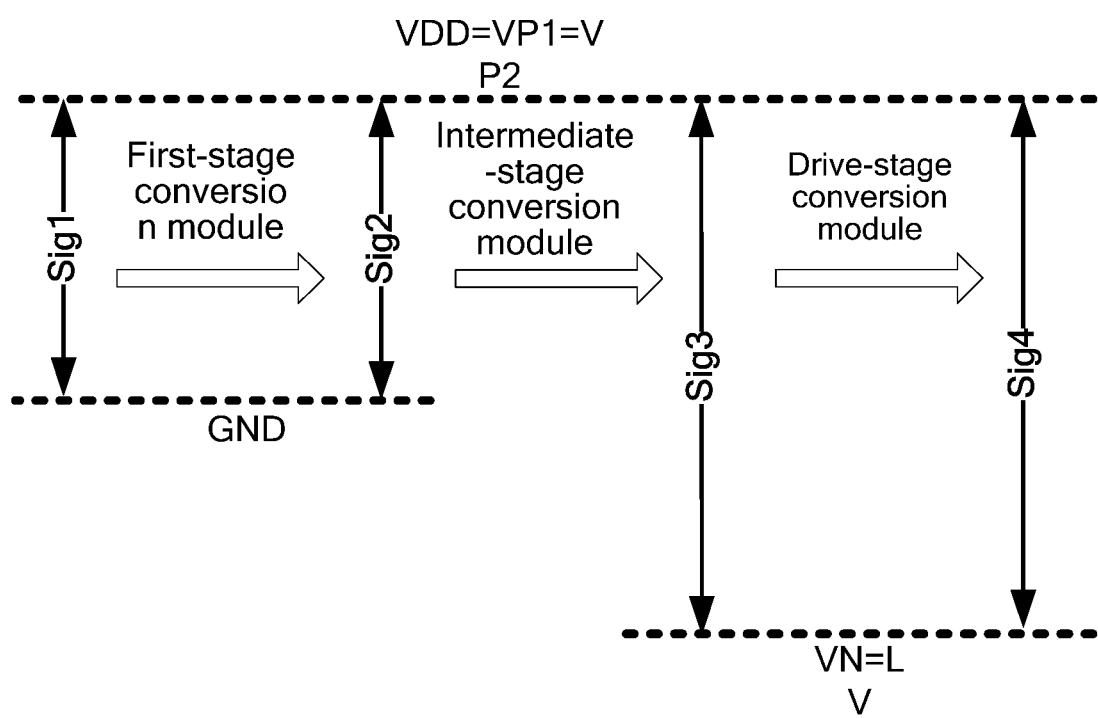
Figure 4:
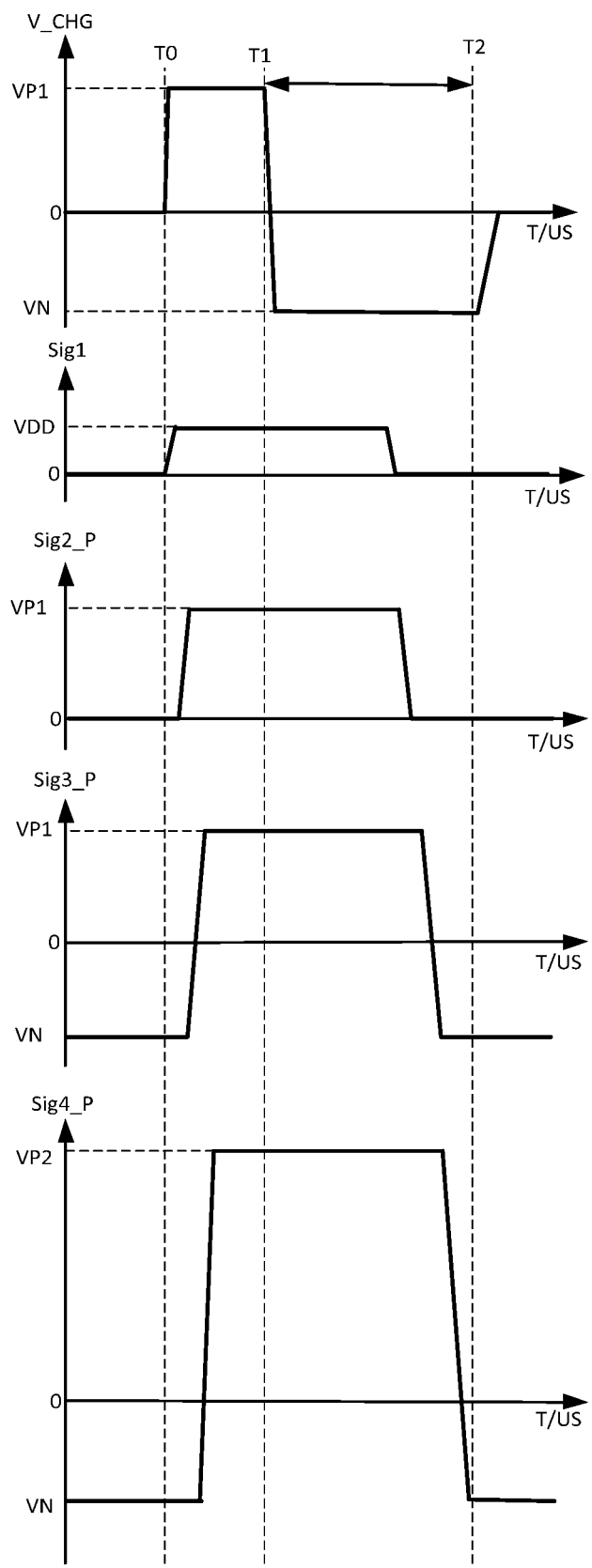

FIG. 1 is a circuit diagram showing a level conversion circuit according to an embodiment;

FIG. 2 is a schematic diagram of voltage domain conversion of a signal in a level conversion circuit according to the present disclosure when a programming operation is performed on a flash FPGA;

FIG. 3 is a schematic diagram of voltage domain conversion of a signal in a level conversion circuit according to the present disclosure when an erasure operation is performed on a flash FPGA; and FIG. 4 is a schematic waveform diagram of a first signal, a second signal, a third signal, a fourth signal, and a gate voltage control signal in a level conversion circuit according to the present disclosure.

DETAILED DESCRIPTION OF THE EMBODIMENTS

Implementations of the Present Disclosure

The specific implementations of the present disclosure will be further described with reference to the accompanying drawings.

The present disclosure provides a logic process-based level conversion circuit of a flash FPGA. Referring to FIG. 1, the level conversion circuit includes a first-stage conversion module, an intermediate-stage conversion module, and a drive-stage conversion module that are successively cascaded. The first-stage conversion module is configured to convert an input first signal Sig1 of a VDD-GND voltage domain into a second signal Sig2 of a VP1-GND voltage domain and output the second signal Sig2 to the intermediate-stage conversion module. The intermediate-stage conversion module is configured to convert the input second signal Sig2 of the VP1-GND voltage domain into a third signal Sig3 of a VP1-VN voltage domain and output the third signal Sig3 to the drive-stage conversion module. The drive-stage conversion module is configured to convert the input third signal Sig3 of the VP1-VN voltage domain into a drive signal Sig4 of a VP2-VN voltage domain and output a word line for driving the flash FPGA. Devices in the drive-stage conversion module are all large in size to ensure a driving capability.

In a working process, a logic process is controlled to output a corresponding voltage combination to complete an erasure operation or a programming operation on the flash FPGA, where the voltage combination includes a core low voltage VDD, an intermediate voltage VP1, a drive-stage voltage VP2, and a negative voltage VN that are provided by the logic process, where VP2≥VP1≥VDD.GND is a grounding voltage with a zero level, and VN<0.

When the programming operation is performed on the flash FPGA, voltage values of the core low voltage VDD, the intermediate voltage VP1, and the drive-stage voltage VP2 provided by the logic process are controlled to increase successively, namely, VDD<VP1<VP2. The voltage value of the drive-stage voltage VP2 is a positive high voltage HV required for programming a flash cell, namely, VP2=HV. In this case, a voltage domain relationship of the signals is shown in FIG. 2. In this state, the drive signal Sig4, of the VP2-VN voltage domain, output by the drive-stage conversion module controls the word line to apply the positive high voltage HV to a gate terminal of the flash cell to complete the programming operation. Typically, if the positive high voltage HV required for programming the flash cell is 8.8 V, VDD, VP1, VP2, and VN can be controlled to be equal to 1.5 V, 3.6 V, 8.8 V, and −2.5 V respectively. In this case, the drive-stage conversion module outputs the drive signal Sig4 to control the word line to apply 8.8 V to the gate terminal of the flash cell.

When the erasure operation is performed on the flash FPGA, voltage values of the intermediate voltage VP1, the drive-stage voltage VP2, and the core low voltage VDD provided by the logic process are controlled to be equal, namely, VDD=VP1=VP2. The negative voltage VN provided by the logic process is controlled to be a negative high voltage LV required for erasing a flash cell, namely, VN=LV. In this case, a voltage domain relationship of the signals is shown in FIG. 3. In this state, the drive signal Sig4, of the VP2-VN voltage domain, output by the drive-stage conversion module controls the word line to apply the negative high voltage LV to a gate terminal of the flash cell to complete the erasure operation. Typically, if the negative high voltage LV required for programming the flash cell is −9.5 V, VDD, VP1, VP2, and VN can be controlled to be equal to 1.5 V, 1.5 V, 1.5 V, and −9.5 V respectively. In this case, the drive-stage conversion module outputs the drive signal Sig4 to control the word line to apply −9.5 V to the gate terminal of the flash cell.

Three-stage level conversion is performed by using the three conversion modules, to realize conversion to the intermediate voltage and then to the highest voltage, which reduces the pressure of conversion at each stage, ensures a capability of driving the next stage, increases the conversion speed, and provides a large driving capability at the last stage.

In an embodiment, the input first signal Sig1 is a single-ended signal, and the second signal Sig2, the third signal Sig3, and the drive signal Sig4 are all differential signals. Therefore, as shown in FIG. 1, in the first-stage conversion module, sources of PMOS transistors P1 and P2 are connected to each other and to the intermediate voltage VP1, a drain of P1 is connected to a gate of P2 and a drain of an NMOS transistor N1, a drain of P2 is connected to a gate of P1 and a drain of an NMOS transistor N2, and a source of N1 and a source of N2 are connected to each other and to GND.P1, P2, N1, and N2 constitute a positive feedback structure of a differential input. A source of a PMOS transistor P0 is connected to the core low voltage VDD, a drain of P0 is connected to a drain of an NMOS transistor N0, a source of N0 is connected to GND, a gate of P0 and a gate of N0 are connected, the gate of P0 obtains the first signal Sig1, and the gate of N0 obtains the first signal Sig1. P0 and N0 constitute an inverter. The drain of P0 outputs an inverse signal Sig1_N of the first signal Sig1 and is connected to a gate of N1. A gate of N2 obtains the first signal Sig1. The drain of P1 and the drain of P2 are configured as a differential pair for outputting the second signal Sig2, including Sig2_P and Sig2_N. The drain of P1 outputs Sig2_P that has the same phase as the first signal Sig1, and the drain of P2 outputs Sig2_N.

The intermediate-stage conversion module and the drive-stage conversion module mainly include the positive feedback structure of the differential input. The positive feedback structure of the differential input in the intermediate-stage conversion module is connected to the intermediate voltage VP1 and the negative voltage VN. The positive feedback structure of the differential input in the drive-stage conversion module is connected to the drive-stage voltage VP2 and the negative voltage VN. In an embodiment, each of the intermediate-stage conversion module and the drive-stage conversion module is provided with voltage dividing switch transistors for voltage division, and the voltage dividing switch transistors of each of the two conversion modules are controlled by a gate voltage control signal V_CHG. Voltage values of the gate voltage control signal V_CHG are different in different time periods of a working cycle of the level conversion circuit to adjust states of the voltage dividing switch transistors and reduce the working time of a device in the level conversion circuit under a break-down voltage, thereby improving the reliability of the device in the level conversion circuit.

As shown in FIG. 1, in the intermediate-stage conversion module, sources of PMOS transistors P3, P4, P5, and P6 are connected to each other and to the intermediate voltage VP1, a drain of P4 is connected to a drain of an NMOS transistor N3, and a source of N3 is connected to a drain of an NMOS transistor N5. A drain of P5 is connected to a drain of an NMOS transistor N4, and a source of N4 is connected to a drain of an NMOS transistor N6. A source of N5 and a source of N6 are connected to each other and to the negative voltage VN. A drain of P3, a gate of P4, the drain of P5, and a gate of N5 are all connected, and a drain of P6, a gate of P5, the drain of P4, and a gate of N6 are all connected. A gate of P3 and a gate of P6 are configured as a differential pair for obtaining the second signal Sig2. The gate of P3 is connected to the drain of P1 to obtain Sig2_P, and the gate of P6 is connected to the drain of P2 to obtain Sig2_N. The gate of N5 and the gate of N6 are configured as a differential pair for outputting the third signal Sig3, including Sig3_P and Sig3_N. The gate of N6 outputs Sig3_P that has the same phase as the first signal Sig1, and the gate of N5 outputs Sig3_N.N3 and N4 are configured as the voltage dividing switch transistors in the intermediate-stage conversion module, and a gate of N3 and a gate of N4 are connected and controlled by the gate voltage control signal V_CHG.

In the drive-stage conversion module, sources of PMOS transistors P7 and P8 are connected to each other and to the drive-stage voltage VP2, a drain of P7 is connected to a gate of P8 and a drain of an NMOS transistor N7, and a drain of P8 is connected to a gate of P7 and a drain of an NMOS transistor N8, a source of N7 is connected to a drain of an NMOS transistor N9, a source of N8 is connected to a drain of an NMOS transistor N10, and a source of N9 and a source of N10 are connected to each other and to the negative voltage VN. A gate of N9 and a gate of N10 are configured as a differential pair for obtaining the third signal Sig3. The gate of N9 is connected to the gate of N6 to obtain Sig3_P, and the gate of N10 is connected to the gate of N5 to obtain Sig3_N. The drain of N7 and the drain of N8 are configured as a differential pair for outputting the drive signal Sig4, including Sig4_P and Sig4_N. The drain of N8 outputs Sig4_P that has the same phase as the first signal Sig1, and the drain of N7 outputs Sig4_N.N7 and N8 are configured as the voltage dividing switch transistors in the drive-stage conversion module, and a gate of N7 and a gate of N8 are connected and controlled by the gate voltage control signal V_CHG.

In a working cycle of performing the programming operation on the flash FPGA, the working cycle successively includes a level conversion phase and a maintenance phase. The level conversion phase is used to complete signal conversion in different voltage domains, and the maintenance phase is used to maintain a signal state. (1) In the level conversion phase from T0 to T1 at the beginning of the working cycle, the voltage value of the gate voltage control signal V_CHG is equal to the intermediate voltage VP1. When the programming operation is performed, VDD<VP1<VP2. The positive high voltage HV in the drive-stage conversion module cannot be transmitted to N9 and N10 due to the clamping of the voltage dividing switch transistors N7 and N8. In this case, the voltage differences among the gate, the source and the drain of N7 are small, the voltage differences among the gate, the source and the drain of N8 are small, the voltage differences among the gate, the source and the drain of N9 are small, and the voltage differences among the gate, the source and the drain of N10 are small, thereby increasing safety voltage tolerances of N7, N8, N9, and N10. (2) In the maintenance phase from T1 to T2 of the working cycle, the voltage value of the gate voltage control signal V_CHG is the negative voltage VN, the voltage dividing switch transistors N3 and N4 in the intermediate-stage conversion module are turned off, and the voltage dividing switch transistors N7 and N8 in the drive-stage conversion module are turned off. A state of the level conversion circuit is maintained by voltages of parasitic capacitors C0, C1, C2, and C3 of the circuit and the level conversion circuit is not driven in a pull-down manner. Charges on the parasitic capacitors C0, C1, C2, and C3 enable data to be retained, but a voltage difference formed by the charges on the parasitic capacitors is less than the break-down voltage of the device to protect P3, P4, P5, and P6 in the intermediate-stage conversion module and P7 and P8 in the drive-stage conversion module.

The intermediate-stage conversion module has the parasitic capacitor C0 between P4 and N3 and the parasitic capacitor C1 between P5 and N4. The drive-stage conversion module has the parasitic capacitor C2 between P7 and N7 and the parasitic capacitor C3 between P8 and N8.

In a working cycle of performing the erasure operation on the flash FPGA, the working cycle successively includes a level conversion phase and a maintenance phase. The level conversion phase is used to complete signal conversion in different voltage domains, and the maintenance phase is used to maintain a signal state. (1) In the level conversion phase from T0 to T1 at the beginning of the working cycle, the voltage value of the gate voltage control signal V_CHG is equal to the intermediate voltage VP1. When the erasure operation is performed, VDD=VP1=VP2. (2) In the maintenance phase from T1 to T2 of the working cycle, the voltage value of the gate voltage control signal V_CHG is the negative voltage VN. When the erasure operation is performed, VN=LV. The voltage dividing switch transistors N3 and N4 in the intermediate-stage conversion module are turned off, and the voltage dividing switch transistors N7 and N8 in the drive-stage conversion module are turned off, which is similar to that when the programming operation is performed. A state of the level conversion circuit is maintained by voltages of parasitic capacitors C0, C1, C2, and C3 of the circuit and the level conversion circuit is not driven in a pull-down manner. Charges on the parasitic capacitors C0, C1, C2, and C3 enable data to be retained, but a voltage difference formed by the charges on the parasitic capacitors is less than the break-down voltage of the device to protect P3, P4, P5, and P6 in the intermediate-stage conversion module and P7 and P8 in the drive-stage conversion module.

The duration of the level conversion phase and duration of the maintenance phase are set based on an actual situation. Generally, the duration of the level conversion phase is set as the duration of completing voltage domain conversion of the signal and driving a word line circuit plus a certain design margin. After the duration of the level conversion phase is determined, the remaining duration of the working cycle is set as the duration of the maintenance phase. An actual simulation result shows that the maximum duration of completing voltage domain conversion of the signal is about 1.5 μs. Therefore, the duration of the level conversion phase may be set to 2 μs. If there are 10 μs in the working cycle, the duration of the maintenance phase is 8 μs. In this example, alternatively, the duration of the level conversion phase may be 3 μs, and the duration of the maintenance phase may be set to 7 μs. Generally, in any working cycle, the duration of the maintenance phase is greater than the duration of the level conversion phase. For details, reference is made to a waveform comparison diagram shown in FIG. 4.

In one example, in a working cycle of performing the programming operation on the flash FPGA, VDD=1.5 V, VP1=3.6 V, VP2=8.8 V, and VN=−2.5 V. The difference between VP2 and VN is 11.3 V, which is less than the safety voltage tolerance of a 5 V device with a break-down voltage of 12 V by 0.7 V. Voltages at gate terminals of N3, N4, N7, and N8 are controlled by using the gate voltage control signal, such that V_CHG=VP1=3.6 V in the level conversion phase from T0 to T1 of a smaller half cycle at the beginning of each working cycle. VP2, which is equal to 8.8 V, cannot be transmitted to N9 and N10 due to the clamping of tandem N7 and N8. In this case, the voltage differences among the gate, the source and the drain of N7 are small, the voltage differences among the gate, the source and the drain of N8 are small, the voltage differences among the gate, the source and the drain of N9 are small, and the voltage differences among the gate, the source and the drain of N10 are small, thereby realizing relatively large safety voltage tolerances. In the maintenance phase from T1 to T2 of the remaining larger half cycle of each working cycle, V_CHG=VN=−2.5 V and N3, N4, N7, and N8 are turned off, thereby protecting P3, P4, P5, P6, P7, and P8.

In a working cycle of performing the erasure operation on the flash FPGA, VDD=VP1=VP2=1.5 V and VN=−9.5V The difference between VP2 and VN is 11 V, which is less than a safety voltage tolerance of a 5 V device with a break-down voltage of 12 V by 1V. The voltages at the gate terminals of N3, N4, N7, and N8 are controlled by using the gate voltage control signal, such that V_CHG=VP1=1.5V in the level conversion phase from T0 to T1 of the smaller half cycle at the beginning of each working cycle. In the maintenance phase from T1 to T2 of the remaining larger half cycle of each working cycle, V_CHG=VN=−9.5V and N3, N4, N7, and N8 are turned off, thereby protecting P3, P4, P5, P6, P7, and P8.

The above examples merely describe preferred implementations of the present disclosure, and the present disclosure is not limited to the above embodiments. It can be understood that improvements and modifications directly derived from the examples by those skilled in the art without departing from the spirit and concept of the present disclosure should be regarded as falling within the protection scope of the present disclosure.

What is claimed is:

1. A logic process-based level conversion circuit of a flash field programmable gate array (FPGA) comprising a first-stage conversion module, an intermediate-stage conversion module, and a drive-stage conversion module, wherein the first-stage conversion module, the intermediate-stage conversion module, and the drive-stage conversion module are successively cascaded, wherein the first-stage conversion module is configured to convert an input first signal of a VDD-GND voltage domain into a second signal of a VP1-GND voltage domain and output the second signal to the intermediate-stage conversion module; the intermediate-stage conversion module is configured to convert the input second signal of the VP1-GND voltage domain into a third signal of a VP1-VN voltage domain and output the third signal to the drive-stage conversion module; and the drive-stage conversion module is configured to convert the input third signal of the VP1-VN voltage domain into a drive signal of a VP2-VN voltage domain and output a word line for driving the flash FPGA; and a logic process is controlled to output a corresponding voltage combination to complete an erasure operation or a programming operation on the flash FPGA, wherein the voltage combination comprises a core low voltage VDD, an intermediate voltage VP1, a drive-stage voltage VP2, and a negative voltage VN, wherein the core low voltage VDD, the intermediate voltage VP1, the drive-stage voltage VP2, and the negative voltage VN are provided by the logic process, wherein GND is a grounding voltage and VP2≥VP1≥VDD.

2. The logic process-based level conversion circuit according to claim 1, wherein when the programming operation is performed on the flash FPGA, a voltage value of the core low voltage VDD, a voltage value of the intermediate voltage VP1, and a voltage value of the drive-stage voltage VP2 provided by the logic process are controlled to increase successively, the voltage value of the drive-stage voltage VP2 is a positive high voltage HV required for programming a flash cell, and the drive signal of the VP2-VN voltage domain output by the drive-stage conversion module controls the word line to apply the positive high voltage HV to a gate terminal of the flash cell to complete the programming operation.

3. The logic process-based level conversion circuit according to claim 1, wherein when the erasure operation is performed on the flash FPGA, voltage values of the intermediate voltage VP1, the drive-stage voltage VP2, and the core low voltage VDD provided by the logic process are controlled to be equal, the negative voltage VN provided by the logic process is controlled to be a negative high voltage LV required for erasing a flash cell, and the drive signal of the VP2-VN voltage domain output by the drive-stage conversion module controls the word line to apply the negative high voltage LV to a gate terminal of the flash cell to complete the erasure operation.

4. The logic process-based level conversion circuit according to claim 1, wherein each of the intermediate-stage conversion module and the drive-stage conversion module is provided with voltage dividing switch transistors for voltage division, and the voltage dividing switch transistors of each of the intermediate-stage conversion module and the drive-stage conversion module are controlled by a gate voltage control signal, wherein voltage values of the gate voltage control signal are different in different time periods of a working cycle of the logic process-based level conversion circuit to adjust states of the voltage dividing switch transistors and reduce a working time of a device in the logic process-based level conversion circuit under a break-down voltage.

5. The logic process-based level conversion circuit according to claim 4, wherein the second signal and the third signal are differential signals;

wherein in the intermediate-stage conversion module:

sources of a positive channel metal oxide semiconductor (PMOS) transistor P3, a PMOS transistor P4, a PMOS transistor P5, and a PMOS transistor P6 are connected to each other and to the intermediate voltage VP1; a drain of the PMOS transistor P4 is connected to a drain of a negative channel metal oxide semiconductor (NMOS) transistor N3, and a source of the NMOS transistor N3 is connected to a drain of an NMOS transistor N5; a drain of the PMOS transistor P5 is connected to a drain of an NMOS transistor N4, and a source of the NMOS transistor N4 is connected to a drain of an NMOS transistor N6; a source of the NMOS transistor N5 and a source of the NMOS transistor N6 are connected to each other and to the negative voltage VN; a drain of the PMOS transistor P3, a gate of the PMOS transistor P4, the drain of the PMOS transistor P5, and a gate of the NMOS transistor N5 are connected; a drain of the PMOS transistor P6, a gate of the PMOS transistor P5, the drain of the PMOS transistor P4, and a gate of the NMOS transistor N6 are connected; a gate of the PMOS transistor P3 and a gate of the PMOS transistor P6 are configured as a first differential pair for obtaining the second signal; the gate of the NMOS transistor N5 and the gate of the NMOS transistor N6 are configured as a second differential pair for outputting the third signal; the NMOS transistor N3 and the NMOS transistor N4 are configured as the voltage dividing switch transistors in the intermediate-stage conversion module; and a gate of the NMOS transistor N3 and a gate of the NMOS transistor N4 are connected and controlled by the gate voltage control signal.

6. The logic process-based level conversion circuit according to claim 5, wherein in any working cycle of performing the programming operation or the erasure operation on the flash FPGA, the working cycle successively comprises a level conversion phase and a maintenance phase, wherein the level conversion phase is used to complete signal conversion in different voltage domains, and the maintenance phase is used to maintain a signal state;

in the maintenance phase of the working cycle, the voltage value of the gate voltage control signal is the negative voltage VN, the voltage dividing switch transistors N3 and N4 in the intermediate-stage conversion module are turned off, the voltage dividing switch transistors N7 and N8 in the drive-stage conversion module are turned off, a state of the logic process-based level conversion circuit is maintained by voltages of parasitic capacitors of the logic process-based level conversion circuit and the logic process-based level conversion circuit is not driven in a pull-down manner; charges on the parasitic capacitors enable data to be retained, but a voltage difference formed by the charges on the parasitic capacitors is less than the break-down voltage of the device to protect the PMOS transistor P3, the PMOS transistor P4, the PMOS transistor P5, and the PMOS transistor P6 in the intermediate-stage conversion module and the PMOS transistor P7 and the PMOS transistor P8 in the drive-stage conversion module; and the intermediate-stage conversion module has a first parasitic capacitor between the PMOS transistor P4 and the NMOS transistor N3 and a second parasitic capacitor between the PMOS transistor P5 and the NMOS transistor N4, and the drive-stage conversion module has a third parasitic capacitor between the PMOS transistor P7 and the NMOS transistor N7 and a fourth parasitic capacitor between the PMOS transistor P8 and the NMOS transistor N8.

7. The logic process-based level conversion circuit according to claim 6, wherein in any working cycle of performing the programming operation or the erasure operation on the flash FPGA, in the level conversion phase of the working cycle, the voltage value of the gate voltage control signal is equal to the intermediate voltage VP1; wherein when the programming operation is performed on the flash FPGA, the positive high voltage HV in the drive-stage conversion module is not transmitted to the NMOS transistor N9 and the NMOS transistor N10 due to clamping of the voltage dividing switch transistors N7 and N8, such that safety voltage tolerances of the NMOS transistor N7, the NMOS transistor N8, the NMOS transistor N9, and the NMOS transistor N10 are increased.

8. The logic process-based level conversion circuit according to claim 7, wherein in any working cycle, a duration of the maintenance phase is greater than a duration of the level conversion phase.

9. The logic process-based level conversion circuit according to claim 4, wherein the third signal and the drive signal are differential signals;

wherein in the drive-stage conversion module:
sources of a PMOS transistor P7 and a PMOS transistor P8 are connected to each other and to the drive-stage voltage VP2; a drain of the PMOS transistor P7 is connected to a gate of the PMOS transistor P8 and a drain of an NMOS transistor N7; a drain of the PMOS transistor P8 is connected to a gate of the PMOS transistor P7 and a drain of an NMOS transistor N8; a source of the NMOS transistor N7 is connected to a drain of an NMOS transistor N9; a source of the NMOS transistor N8 is connected to a drain of an NMOS transistor N10; a source of the NMOS transistor N9 and a source of the NMOS transistor N10 are connected to each other and to the negative voltage VN; a gate of the NMOS transistor N9 and a gate of the NMOS transistor N10 are configured as a first differential pair for obtaining the third signal; the drain of the NMOS transistor N7 and the drain of the NMOS transistor N8 are configured as a second differential pair for outputting the drive signal; the NMOS transistor N7 and the NMOS transistor N8 are configured as the voltage dividing switch transistors in the drive-stage conversion module; and a gate of the NMOS transistor N7 and a gate of the NMOS transistor N8 are connected and controlled by the gate voltage control signal.

10. The logic process-based level conversion circuit according to claim 9, wherein in any working cycle of performing the programming operation or the erasure operation on the flash FPGA, the working cycle successively comprises a level conversion phase and a maintenance phase, wherein the level conversion phase is used to complete signal conversion in different voltage domains, and the maintenance phase is used to maintain a signal state;

in the maintenance phase of the working cycle, the voltage value of the gate voltage control signal is the negative voltage VN, the voltage dividing switch transistors N3 and N4 in the intermediate-stage conversion module are turned off, the voltage dividing switch transistors N7 and N8 in the drive-stage conversion module are turned off, a state of the logic process-based level conversion circuit is maintained by voltages of parasitic capacitors of the logic process-based level conversion circuit and the logic process-based level conversion circuit is not driven in a pull-down manner; charges on the parasitic capacitors enable data to be retained, but a voltage difference formed by the charges on the parasitic capacitors is less than the break-down voltage of the device to protect the PMOS transistor P3, the PMOS transistor P4, the PMOS transistor P5, and the PMOS transistor P6 in the intermediate-stage conversion module and the PMOS transistor P7 and the PMOS transistor P8 in the drive-stage conversion module; and the intermediate-stage conversion module has a first parasitic capacitor between the PMOS transistor P4 and the NMOS transistor N3 and a second parasitic capacitor between the PMOS transistor P5 and the NMOS transistor N4, and the drive-stage conversion module has a third parasitic capacitor between the PMOS transistor P7 and the NMOS transistor N7 and a fourth parasitic capacitor between the PMOS transistor P8 and the NMOS transistor N8.

11. The logic process-based level conversion circuit according to claim 10, wherein in any working cycle of performing the programming operation or the erasure operation on the flash FPGA, in the level conversion phase of the working cycle, the voltage value of the gate voltage control signal is equal to the intermediate voltage VP1; wherein when the programming operation is performed on the flash FPGA, the positive high voltage HV in the drive-stage conversion module is not transmitted to the NMOS transistor N9 and the NMOS transistor N10 due to clamping of the voltage dividing switch transistors N7 and N8, such that safety voltage tolerances of the NMOS transistor N7, the NMOS transistor N8, the NMOS transistor N9, and the NMOS transistor N10 are increased.

12. The logic process-based level conversion circuit according to claim 11, wherein in any working cycle, a duration of the maintenance phase is greater than a duration of the level conversion phase.

13. The logic process-based level conversion circuit according to claim 1, wherein the first signal is a single-ended signal, and the second signal is a differential signal; and in the first-stage conversion module, sources of a PMOS transistor P1 and a PMOS transistor P2 are connected to each other and to the intermediate voltage VP1, a drain of the PMOS transistor P1 is connected to a gate of the PMOS transistor P2 and a drain of an NMOS transistor N1, a drain of the PMOS transistor P2 is connected to a gate of the PMOS transistor P1 and a drain of an NMOS transistor N2, and a source of the NMOS transistor N1 and a source of the NMOS transistor N2 are connected to each other and to GND; and a source of a PMOS transistor P0 is connected to the core low voltage VDD, a drain of the PMOS transistor P0 is connected to a drain of an NMOS transistor N0, a source of the NMOS transistor N0 is connected to GND, a gate of the PMOS transistor P0 and a gate of the NMOS transistor N0 are connected, the gate of the PMOS transistor P0 obtains the first signal, the gate of the NMOS transistor N0 obtains the first signal, the drain of the PMOS transistor P0 outputs an inverse signal of the first signal and is connected to a gate of the NMOS transistor N1, a gate of the NMOS transistor N2 is configured to obtain the first signal, and the drain of the PMOS transistor P1 and the drain of the PMOS transistor P2 are configured as a differential pair for outputting the second signal.

* * * * *